(12) United States Patent
Sato et al.

(10) Patent No.: US 6,534,873 B1
(45) Date of Patent: Mar. 18, 2003

(54) SEMICONDUCTOR PACKAGE AND PRINTED WIRING BOARD FOR SEMICONDUCTOR PACKAGE

(75) Inventors: Yoshizumi Sato, Yokohama (JP); Kenji Sasaoka, Machida (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/655,785

(22) Filed: Sep. 6, 2000

(30) Foreign Application Priority Data

Sep. 6, 1999 (JP) .......................................... 11-251851

(51) Int. Cl.[7] .............................................. H01L 23/48
(52) U.S. Cl. ...................... 257/774; 257/698; 257/780; 257/784; 257/706; 257/707; 257/691
(58) Field of Search ................................ 257/698, 774, 257/780, 784, 706, 707, 691

(56) References Cited

U.S. PATENT DOCUMENTS

| | | | |
|---|---|---|---|
| 5,600,103 A | | 2/1997 | Odaira et al. |
| 5,822,850 A | | 10/1998 | Odaira et al. |
| 5,901,050 A | * | 5/1999 | Imai .......................... 361/820 |
| 6,034,427 A | * | 3/2000 | Lan et al. ................... 257/698 |

FOREIGN PATENT DOCUMENTS

| | | |
|---|---|---|
| EP | 0 620 701 A2 | 10/1994 |
| TW | 236752 | 4/1994 |

OTHER PUBLICATIONS

Takubo, C. et al., "Hybrid Wiring Board, Semiconductor Apparatus, Flexible Substrate, and Fabrication Method of Hybrid Wiring Board", US patent application Ser. No. 09/088,095, filed on Jun. 1, 1998.

* cited by examiner

Primary Examiner—Albert W. Paladini
Assistant Examiner—Luan Thai
(74) Attorney, Agent, or Firm—Finnegan, Henderson, Farabow, Garrett & Dunner, L.L.P.

(57) ABSTRACT

A ground pattern (12) and power supply pattern (13) which are formed on the surface of a printed wiring board (10) are connected to a ground layer (21) and power supply layer (22) formed as the internal layers via bumps (24a, 24b). The ground pattern (12) need not be connected to the ground layer (21) by uniformly plating the inner side surface of a cavity (43), contributing to an increase in yield and a decrease in cost. When a power supply pattern (13) is to be connected to a power supply layer (22) using through holes, the power supply pattern (13) must be spaced apart from signal pins (14) detouring the region where the through holes are to be formed. However, the distance between the power supply pattern and the signal pins can.be reduced by using bumps. The distance between a semiconductor chip (41) and the signal pins (14) can be reduced to improve the electrical characteristics.

9 Claims, 5 Drawing Sheets

US 6,534,873 B1

SEMICONDUCTOR PACKAGE AND PRINTED WIRING BOARD FOR SEMICONDUCTOR PACKAGE

BACKGROUND OF THE INVENTION

The present invention relates to a printed wiring board for a semiconductor package of a multilayered structure having a power supply layer and the like as internal layers, or to a semiconductor package obtained by packaging a semiconductor chip using the above wiring board.

In some cases, a semiconductor package structure employs a multilayered printed wiring board having a solid power supply layer and ground layer as internal layers in order to improve the electrical characteristics of signals.

FIG. 5 shows the two-dimensional structure of a printed wiring board for a semiconductor package 110 used in a semiconductor package to which the present invention pertains. A portion on which a semiconductor chip is placed is removed as a cavity 143. A ground pattern 112 is formed to surround this cavity 143. A power supply pattern 113 is formed around the ground pattern 112. The ground and power supply patterns 112 and 113 are formed as integral rings, respectively. That portion of each pattern which is subjected to wire bonding is exposed, and the remaining portion is covered with an insulating film of solder resist or the like.

A plurality of signal pins 114 are radially formed around the power supply pattern 113. A ball grid array (to be referred to as a BGA hereinafter) 111 is formed around the signal pins 114 to be spaced apart from a wiring region 154. The BGA 111 serves as a connection means for mounting a semiconductor package on a printed wiring board (not shown).

FIG. 7 is a partial enlarged plan view of a portion near the side surface of the cavity 143 when the printed wiring board for a semiconductor package 110 is mounted on a heat spreader and a semiconductor chip is mounted in the cavity 143. FIG. 6 is a longitudinal sectional view taken along the line B—B in FIG. 7.

The printed wiring board for a semiconductor package 110 is adhered on a heat spreader 131 made of a conductive material by using an adhesive tape 132 made of an insulating material. A semiconductor chip 141 is bonded in the cavity 143 of the printed wiring board 110 with silver paste 142. The ground pattern 112, power supply pattern 113, and signal pins 114 are formed on the surface of the printed wiring board 110, while a ground layer 121 and power supply layer 122 are formed as internal layers of the printed wiring board 110. The ground pattern and power supply pattern 112 and 113 are connected to the ground and power supply layers 121 and 122 via through holes 123, respectively. The pads of the semiconductor chip 141 are connected to the ground pattern 112, power supply pattern 113, and signal pins 114 of the printed wiring board 110 via bonding wires 151 to 153, respectively.

The above printed wiring board for a semiconductor package, however, suffers the following problems.

The same plating as in the through hole 123 is made on the inner surface of the cavity 143 to form side wall plating 115. This side wall plating 115 serves to connect the ground pattern 112 near the cavity 143 to the ground layer 121 serving as an internal layer. This allows connecting the ground pattern 112 and ground layer 121 by a short wiring length with a large contact area. This improves the electrical characteristics.

The side wall plating 115 must uniformly cover a very large area as the entire inner side wall of the cavity 143 unlike general through hole plating. In addition, the side wall of the cavity 143 has burs upon forming the cavity 143. It is difficult to uniformly plate an uneven end face, resulting in a low yield and high cost.

Although the ground pattern 112 can be connected to the ground layer 121 via the side wall plating 115, the power supply pattern 113 and power supply layer 122, which are formed around the ground pattern 112, must be connected via the through hole 123. This increases the wiring length, and the number of through holes is limited. This degrades the electrical characteristics to interfere with transfer of a high-speed signal.

As shown in FIG. 7, to bond the power supply pattern 113 with wires 152, no through hole 123 is formed immediately under the power supply pattern 113. The through holes 123 must be formed at positions shifted outside the power supply pattern 113. The signal pins 114 located around the power supply pattern 113 are away from the semiconductor chip 141. This increases the length of the bonding wires 153 for connecting the signal pins 114 to the semiconductor chip 141 and degrades the electrical characteristics.

SUMMARY OF THE INVENTION

It is therefore an object of the present invention to provide a semiconductor package and printed wiring board for a semiconductor package, which can improve the electrical characteristics and reduce the cost.

A semiconductor package according to the present invention comprises a flat mount board, a printed wiring board mounted on the mount board, and a semiconductor chip mounted in a cavity of the printed wiring board on the mount board and electrically connected to the printed wiring board, the printed wiring board comprising a wiring pattern formed on a surface of the printed wiring board, at least one internal layer, and a bump for electrically connecting the wiring pattern and internal layer.

A printed wiring board for a semiconductor package according to the present invention which is electrically connected to a semiconductor chip and has a cavity in which the semiconductor chip is mounted, comprises a wiring pattern formed on a surface of the printed wiring board, at least one internal layer, and a bump for electrically connecting the wiring pattern and internal layer.

The wiring pattern may comprise a first wiring pattern arranged to surround the cavity, a second wiring pattern located around the first wiring pattern so as to surround the cavity, and a plurality of signal pins located around the second wiring pattern so as to surround the cavity. The internal layer may include a first plane internal layer connected to the first wiring layer via the bump and a second plane internal layer connected to the second wiring pattern via the bump.

The first wiring pattern, second wiring pattern, and signal pins are electrically connected to the corresponding pads of the semiconductor chip via bonding wires, respectively.

Each of the first and second wiring patterns is formed into a ring like shape and has a bonding wire connection portion whose surface is exposed and a remaining portion covered with an insulating film of solder resist, and the signal pins are radially formed.

A ball grid array may be located around the signal pins.

The printed wiring board may use a board having a first copper foil for forming a wiring pattern on a first surface, a first bump formed on one of surfaces of the first copper foil, a second copper foil for forming a wiring pattern on a second surface, a first prepreg formed between one surface of the first copper foil and one surface of the second copper foil and electrically connected to the first and second copper foils by extending the first bump through the first prepreg, a third copper foil for forming a wiring pattern on a third surface, a second bump formed on one of surfaces of the third copper foil, a second prepreg formed between the other surface of the first copper foil and one surface of the third copper foil and electrically connected to the first and third copper foils by extending the second bump through the second prepreg, a fourth copper foil for forming a wiring pattern on a fourth surface, a third bump formed on one of surfaces of the fourth copper foil, and a third prepreg formed between the other surface of the second copper foil and one surface of the fourth copper foil and electrically connected to the second and fourth copper foils by extending the third bump through the third prepreg.

In this case, the wiring pattern of the third surface may include the first wiring pattern, second wiring pattern, and signal pins. The wiring pattern of the first surface may include the first or second internal layer, and the wiring pattern of the second surface may include the second or first internal layer.

According to the semiconductor package and printed wiring board for a semiconductor package according to the present invention, the wiring pattern formed on the surface is connected to the internal layer via the bump. The inner side surface of the cavity need not be plated, which increases the yield and reduces the cost.

To connect the wiring pattern and internal layer via the trough hole, the through hole must be formed beyond the wiring pattern formation region to increase the distance between the semiconductor chip and the signal pins located farthest from the cavity. However, the bump can be located immediately under the wiring pattern to shorten the distance between the signal pin and semiconductor chip, thereby improving the electrical characteristics.

DESCRIPTION OF THE PREFERRED EMBODIMENT

A preferred embodiment of the present invention will be described with reference to the accompanying drawings.

Figure 3:
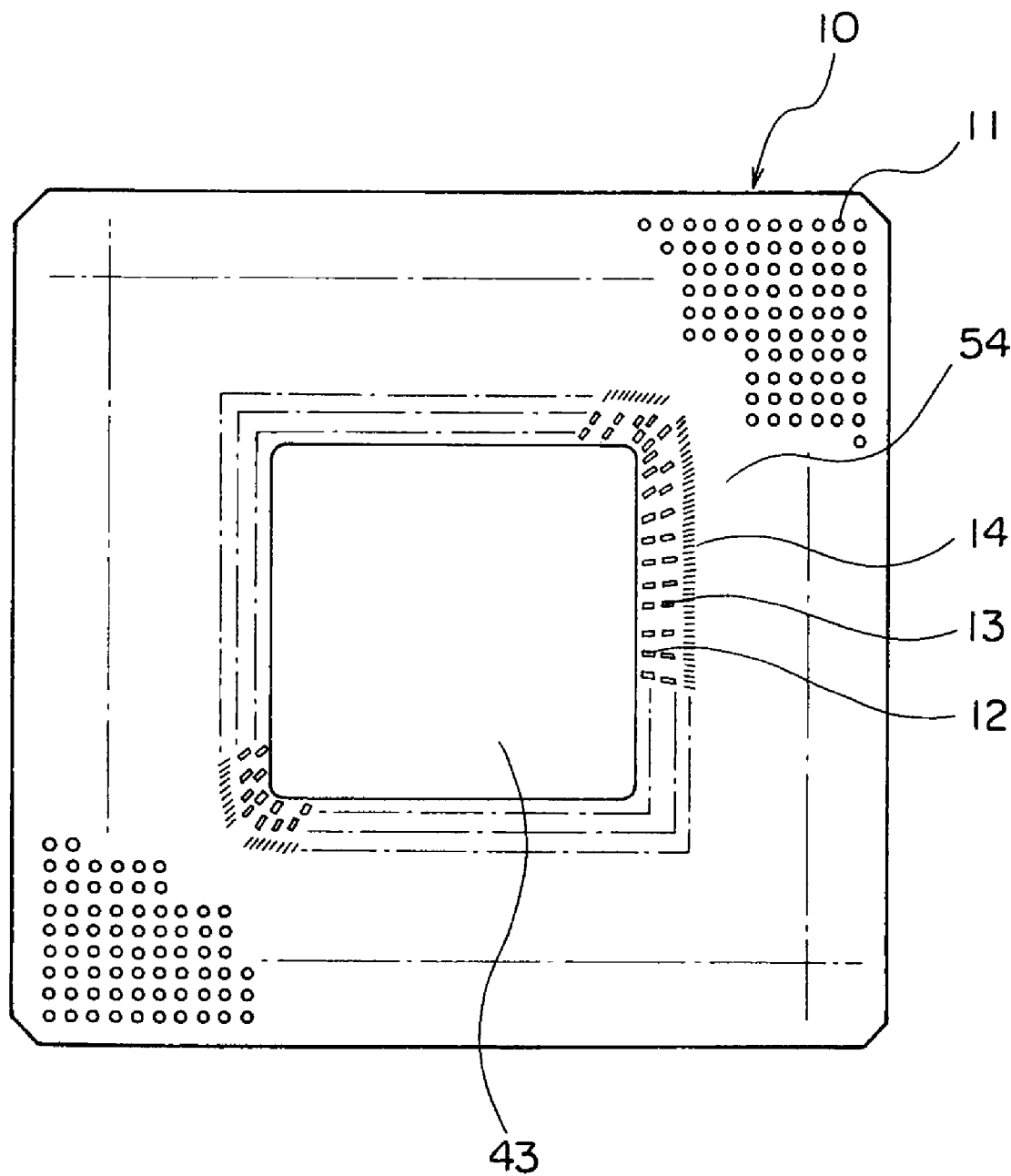
FIG. 3 is a plan view showing the two-dimensional structure of the printed wiring board of the embodiment shown in FIG. 1.

FIG. 3 shows the two-dimensional structure of a semiconductor package 10 of the embodiment. A ground pattern 12 is formed to surround a cavity 43 formed to mount a semiconductor chip therein. A power supply pattern 13 is formed around the ground pattern 12. Each of the ground and power supply patterns 12 and 13 is integrally formed into a ring-like shape. Those surface portions of the patterns 12 and 13 which are to be wire-bonded are exposed, and the remaining portions are covered with an insulating film of solder resist.

A plurality of radial signal pins 14 are formed around the power supply pattern 13. A BGA 11 is formed around the signal pins 14 to interpose a wiring region 54 between them.

Figure 1:
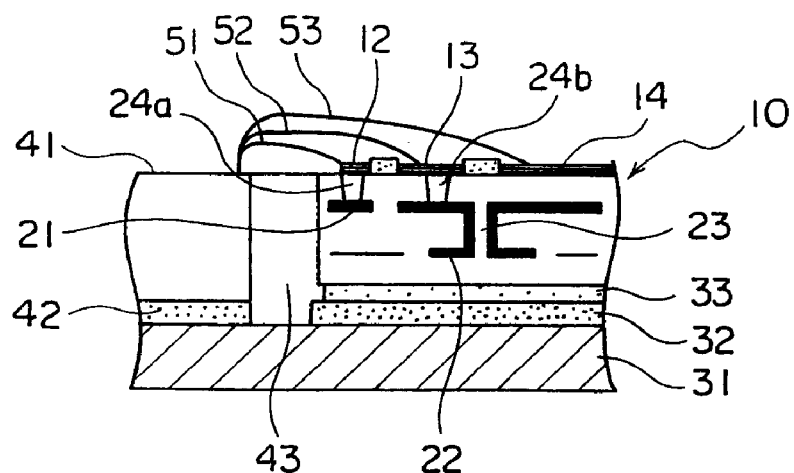
FIG. 1 is a sectional view showing the longitudinal section of a semiconductor package according to an embodiment of the present invention and a printed wiring board used for this semiconductor package.
Figure 2:
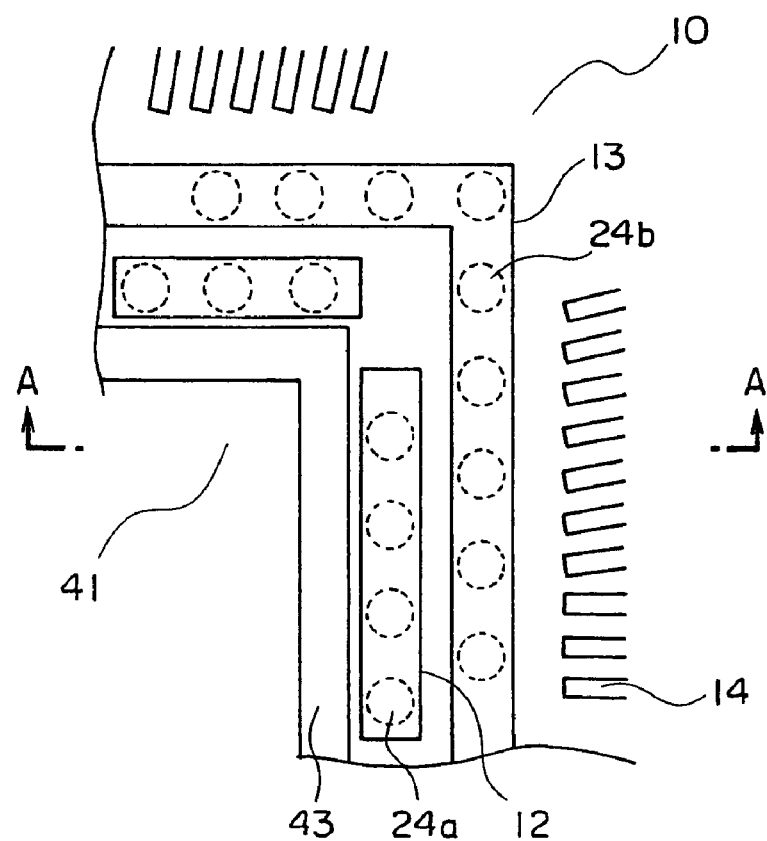
FIG. 2 is a partial enlarged plan view showing a portion around a cavity in the semiconductor package of the embodiment shown in FIG. 1.

FIG. 2 is a partial enlarged plan view of the two-dimensional structure along the side surface of the cavity 43 when the printed wiring board for a semiconductor package 10 is mounted on a heat spreader and a semiconductor chip is mounted in the cavity 43. FIG. 1 shows the longitudinal section of the structure along the line A—A in FIG. 2.

The printed wiring board for a semiconductor package 10 is adhered onto a heat spreader 31 with a double-coated tape 32 made of an insulating material. A semiconductor chip 41 is adhered in the cavity 43 on the printed wiring board 10 with silver paste 42.

As described above, the ground pattern 12, power supply pattern 13, and signal pins 14 are formed on the printed wiring board 10, and a ground layer 21 and power supply layer 22 are formed as the internal layers. The ground pattern 12 and power supply pattern 13 are connected to the ground layer 21 and power supply layer 22 via bumps 24a and 24b, respectively. The pads of the semiconductor chip 41 are connected to the ground pattern 12, power supply pattern 13, and signal pins 14 of the printed wiring board 10 via bonding wires 51 to 53.

Figure 5:
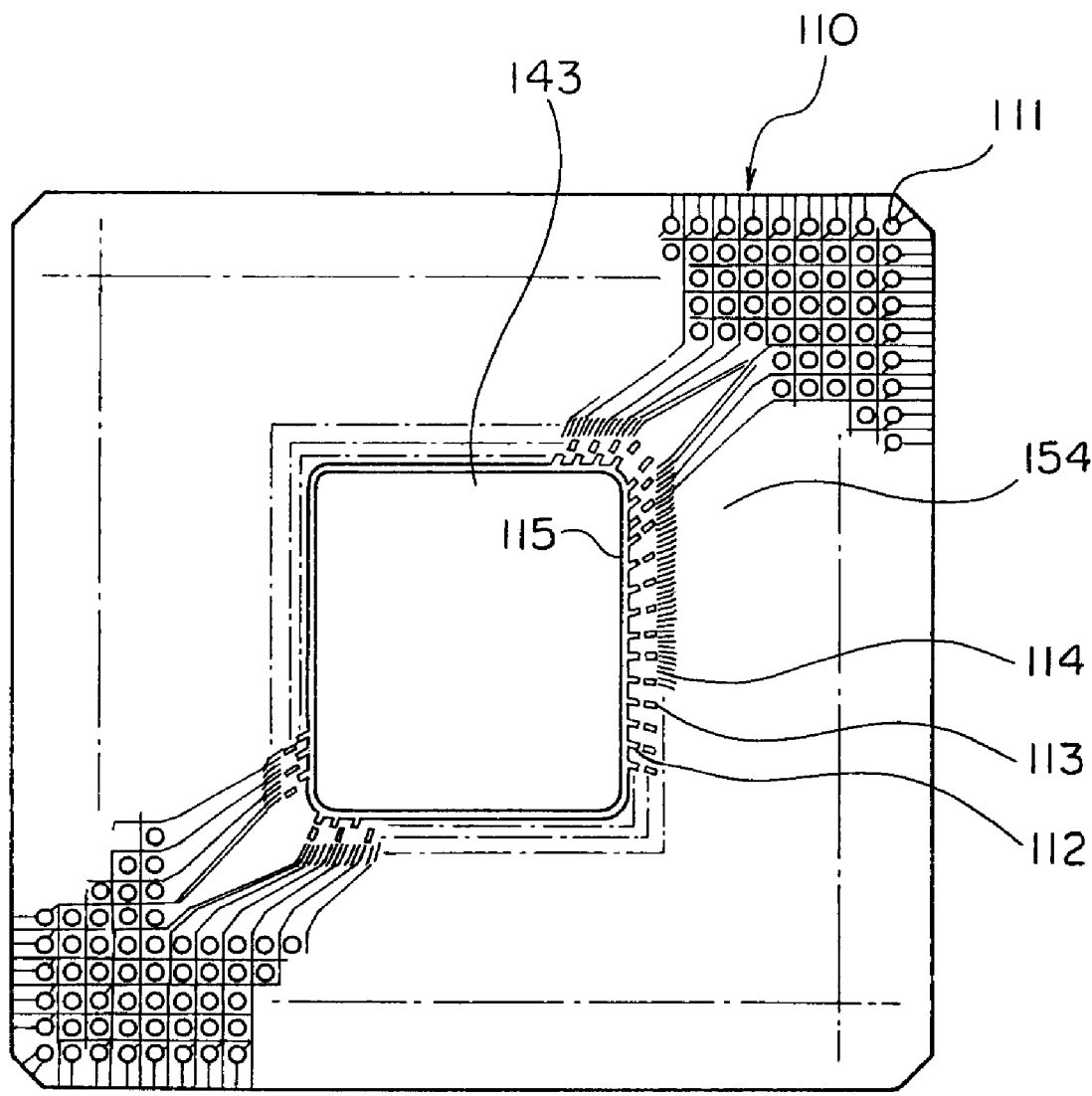
FIG. 5 is a plan view showing the two-dimensional structure of a printed wiring board associated with the present invention.
Figure 6:
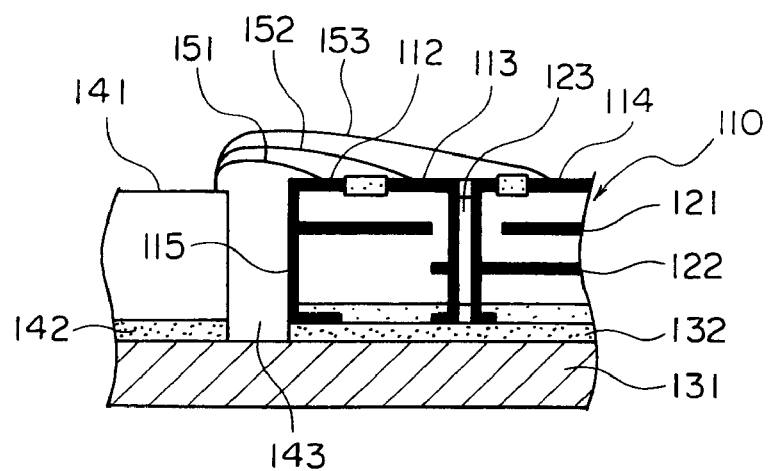
FIG. 6 is a sectional view showing the longitudinal section of the structure along the line B—B in FIG. 7.
Figure 7:
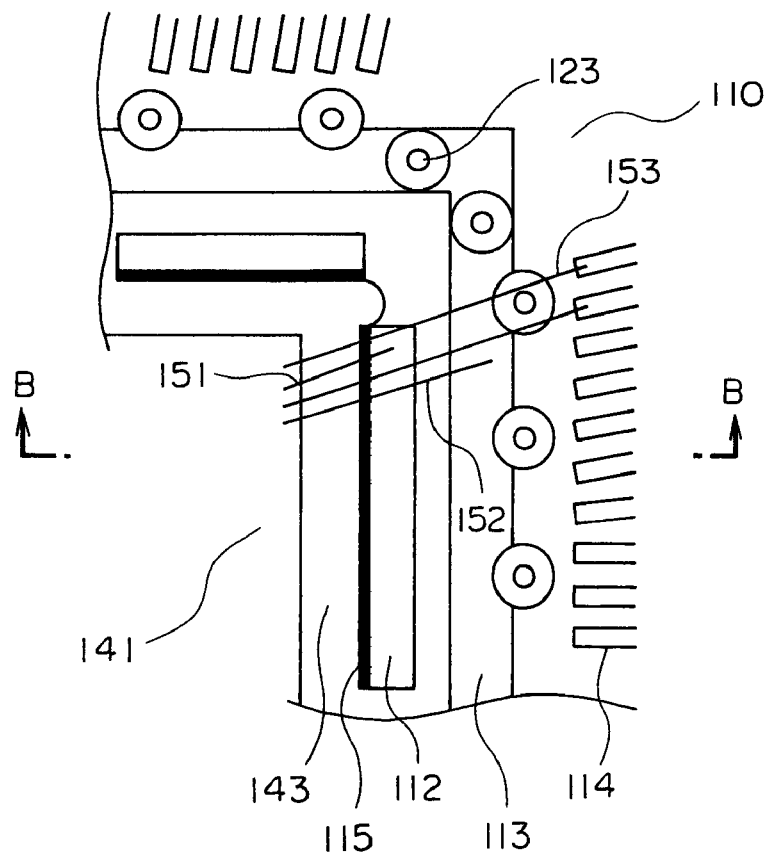
FIG. 7 is a partial enlarged plan view showing a portion around a cavity of a semiconductor package shown in FIG. 5.

The cavity 143 of the printed wiring board shown in FIG. 5 has a plated inner side surface, and this side wall plating 115 connects the ground pattern 112 and the ground layer 121 serving as the internal layer. It is difficult to uniformly form the side wall plating 115, which results in a decrease in yield and an increase in cost.

To the contrary, no plating is made on the inner surface of the cavity 43 in the printed wiring board of this embodiment. The ground pattern 12 is connected to the ground layer 21 via bumps 24a. Similarly, the power supply pattern 13 is connected to the power supply layer 22 via bumps 24b. The problem resulting from side wall plating can be solved to contribute to an increase in yield and a decrease in cost.

In the printed wiring board shown in FIG. 5, the power supply pattern 113 is connected to the power supply layer 122 via through holes 123. The through holes 123 must be shifted outside away from the power supply pattern 113 because the power supply pattern 113 undergoes wire bonding. The power supply pattern 113 must be spaced apart from the signal pins 14.

In this embodiment, the ground pattern 12 and power supply pattern 13 are connected to the ground layer 21 and power supply layer via bumps 24a and 24b, respectively, without using through holes. Since the bumps 24a and 24b do not influence the bonding region, they can be formed immediately under the ground pattern 12 and power supply pattern 13. The power supply pattern 13 can come close to the signal pins 14. The lengths of the bonding wires for connecting the signal pins 14 and the pads of the semiconductor chip 41 can be shorter than those of the conventional structure. As a result, according to this embodiment, the lengths of signal lines can be shortened to improve the electrical characteristics.

The printed wiring board according to this embodiment having the above structure can be manufactured by a method using a so-called Buried Bump Interconnection Technology (to be referred to as B2it hereinafter). This embodiment has a three-layered structure, i.e., two internal layers and one surface layer. However, a four-layered structure having a lower wiring layer in addition to the above three-layered structure may be used.

Figure 4C:
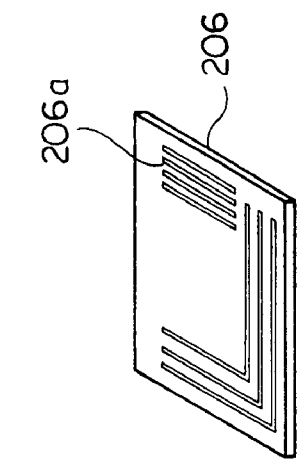
FIGS. 4 to 4F are perspective view showing the steps in manufacturing the printing board of the embodiment shown in FIG. 1.
Figure 4F:
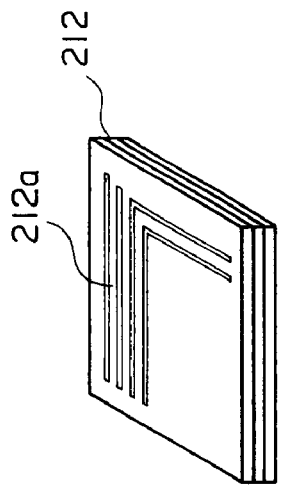
Figure 4B:
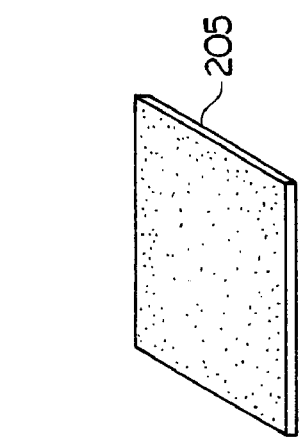
Figure 4E:
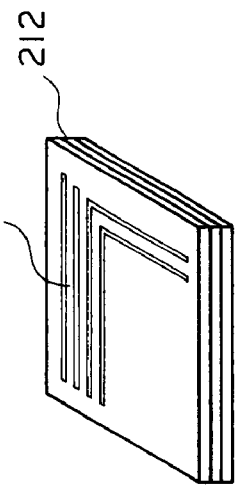
Figure 4A:
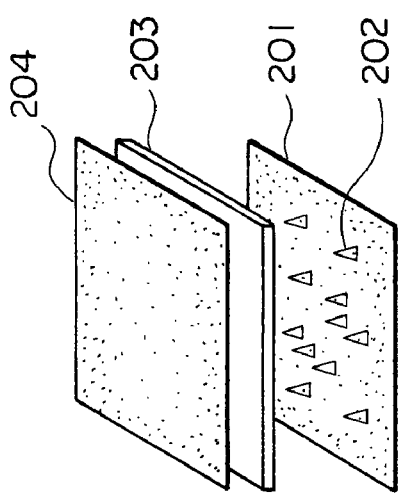

As shown in FIG. 4A, bumps 202 are printed on a copper foil 201, and a prepreg 203 and copper foil 204 are stacked on the copper foil 202. The resultant structure is heated and compressed to form a three-layered structure, as shown in FIG. 4B. The bumps 202 extend through the prepreg 203.

As shown in FIG. 4c, the copper foils 201 and 204 are patterned in desired shapes. More specifically, resist films are formed on the surfaces of the copper foils 201 and 204 by dry film lamination. The resist films are exposed and developed. The copper foils 201 and 204 are etched using the resultant resist patterns as masks, and the resist films are removed from the copper foils to obtain a double-sided wiring board 206 serving as a core. Copper foil patterns 206a formed on the surfaces of the double-sided wiring board 206 are subjected to a so-called blackening process. The surfaces of the copper foils are roughened. The resultant copper foil patterns 206a serve as the ground and power supply layers as the internal layers.

Figure 4D:
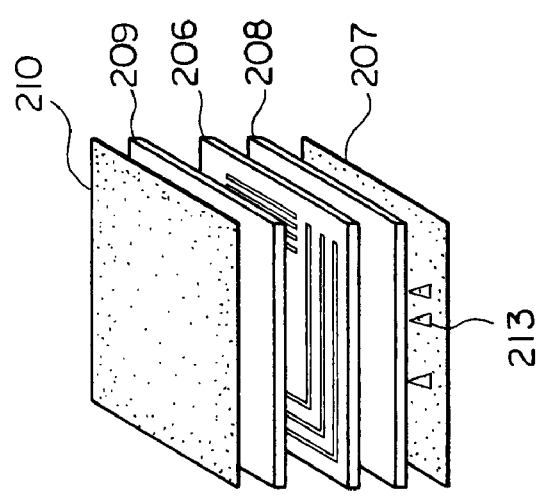

As shown in FIG. 4D, a copper foil 207, a prepreg 206, the two-sided wiring board 206, a prepreg 209, and a copper foil 210 are stacked on each other. In this case, bumps 213 are printed on the copper foils 207 and 210 so that they are located immediately under and above the copper foil patterns 206a. The resultant structure is heated and compressed so that the bumps 213 extend through the prepregs 208 and 209.

As shown in FIG. 4F, the copper foils 207 and 210 are subjected to dry film lamination, exposure, development, etching, and resist film removal to form copper film patterns 212a. The copper film patterns 212a serve as the ground pattern, power supply pattern, and signal pins. The ground and power supply patterns are connected to the ground and power supply layers formed of the copper foil patterns 206a of the double-sided wiring board 206 via the pumps 202 and 213. Nickel and gold electroplating is made at positions to which bonding wires are connected.

The double-sided wiring board 206 has a multilayered structure using the bumps 202. However, such a structure may be formed using through holes.

The above embodiment is merely an example of the present invention. The present invention is not limited by this embodiment. In the above embodiment, the ground pattern 12, power supply pattern 13, and signal pins 14 are arranged outward on the surface of the printed wiring board 10 so as to surround the cavity 43. The ground layer 21 and power supply layer 22 are formed as the upper and lower internal layers. However, the order of the layers may be changed, as needed. The positions of the ground pattern and power supply patterns may be reversed, or the positions of the ground layer and power supply layer may be reversed. The number of internal layers need not be limited to two, i.e., the ground and power supply layers, but can be three or mores. The number of ring-like patterns is not limited to two, i.e., the ring-like ground and power supply patterns. Two power supply patterns for supplying different power supply voltages may be formed. Alternatively, three or more power supply patterns may be formed.

What is claimed is:

1. A semiconductor package comprising:
   a flat mount board;
   a printed wiring board mounted on said mount board; and
   a semiconductor chip mounted in a cavity of said printed wiring board on said mount board and electrically connected to said printed wiring board,
   said printed wiring board comprising
      a wiring pattern formed on a surface of said printed wiring board, the wiring pattern comprising
         a first wiring pattern arranged to surround the cavity,
         a second wiring pattern located around said first wiring pattern so as to surround the cavity, and
         a plurality of signal pins located around said first wiring pattern so as to surround the cavity,
      a first copper foil forming a first plane internal layer and a second plane internal layer,
      a second copper foil for forming a third plane internal layer,
      a third copper foil for forming said first and second wiring patterns and said signal pins,
      a first bump for electrically connecting said first wiring pattern and said first plane internal layer, and
      a second bump for electrically connecting said second wiring pattern and said second plane internal layer,
   said first bump and said second bump formed on one surface of said third copper foil, and having a shape in which a surface contacting said first or second wiring pattern is larger than that contacting said first or second internal layer,
      a second prepreg formed between the other surface of said first copper foil and said one surface of said third copper foil, said first wiring pattern and said first internal layer connected electrically by said first bump extending through said second prepreg, and said second wiring pattern and said second internal layer connected electrically by said second bump extending through said second prepreg,
      a third bump formed on one surface of said first copper foil,
      a first prepreg formed between said one surface of said first copper foil and one surface of said second copper foil, said second and third plane internal layers connected electrically by said third bump extending through said first prepreg,
      a fourth copper foil, and
      a third prepreg formed between the other surface of said second copper foil and one surface of said fourth copper foil.

2. A package according to claim 1, wherein said first wiring pattern, said second wiring pattern, and said signal pins are electrically connected to the corresponding pads of said semiconductor chip via bonding wires, respectively.

3. A package according to claim 1, wherein
   each of said first and second wiring patterns is formed into a ring-like shape and has a bonding wiring connection portion whose surface is exposed and a remaining portion covered with an insulating film, and
   said signal pins are radially formed.

4. A package according to claim 1, wherein a ball grid array is located around said signal pins.

5. A printed wiring board for a semiconductor package which is electrically connected to a semiconductor chip and has a cavity in which said semiconductor chip is mounted, comprising:
   a wiring pattern formed on a surface of said printed wiring board, the wiring pattern comprising a first wiring pattern arranged to surround the cavity,
a second wiring pattern located around said first wiring pattern so as to surround the cavity, and
a plurality of signal pins located around said first wiring pattern so as to surround the cavity;
a first copper foil forming a first plane internal layer and a second plane internal layer,
a second copper foil for forming a third plane internal layer,
a third copper foil for forming said first and second wiring patterns and said signal pins,
a first bump for electrically connecting said first wiring pattern and first plane internal layer, and
a second bump for electrically connecting said second wiring pattern and said second plane internal layer,
said first bump and said second bump formed on one surface of said third copper foil, and having a shape in which a surface contacting said first or second wiring pattern is larger than that contacting said first or second plane internal layer;
a third bump formed on one surface of said first copper foil,
a first prepreg formed between said one surface of said first copper foil and one surface of said second copper foil, said second and third plane internal layers connected electrically by said third bump extending through said first prepreg,
a second prepreg formed between the other surface of said first copper foil and said one surface of said third copper foil, said first wiring pattern and said first internal layer connected electrically by said first bump extending through said second prepreg, and said second wiring pattern and said second internal layer connected electrically by said second bump extending through said second prepreg,
a fourth copper foil, and
a third prepreg formed between the other surface of said second copper foil and one surface of said fourth copper foil.

6. A board according to claim 5, wherein
each of said first and second wiring patterns is formed into a ring-like shape and has a bonding wiring connection portion whose surface is exposed and a remaining portion covered with an insulating film, and
said signal pins are radially formed.

7. A board according to claim 5, wherein a ball grid array is located around said signal pins.

8. A semiconductor package comprising:
a flat mount board;
a printed wiring board mounted on said mount board; and
a semiconductor chip mounted in a cavity of said printed wiring board on said mount board and electrically connected to said printed wiring board,
said printed wiring board manufactured by a process comprising,
printing a first bump on a first copper foil;
stacking said first copper foil, a first prepreg and a second copper foil;
heating and compressing said first copper foil, said first prepreg and said second copper foil to form a three-layered structure in which said first bump extends through said first prepreg to contact said second copper foil;
patterning said first copper foil and said second copper foil in desired shapes;
printing a second bump on a third copper foil;
stacking said third copper foil, a second prepreg, said first copper foil, said first prepreg, said second copper foil, a third prepreg and a fourth copper foil;
heating and compressing said third copper foil, said second prepreg, said first copper foil, said first prepreg, said second copper foil, said third prepreg and said fourth copper foil to form a seven-layered structure in which said second bump extends through said second prepreg to contact said first copper foil; and
patterning said third copper foil and said fourth copper foil in desired shapes,
said second bump having a shape in which a surface contacting said third copper foil is larger than that contacting said first copper foil.

9. A printed wiring board for a semiconductor package which is electrically connected to a semiconductor chip and has a cavity in which said semiconductor chip is mounted, comprising:
said printed wiring board manufactured by a process comprising,
printing a first bump on a first copper foil;
stacking said first copper foil, a first prepreg and a second copper foil;
heating and compressing said first copper foil, said first prepreg and said second copper foil to form a three-layered structure in which said first bump extends through said first prepreg to contact said second copper foil;
patterning said first copper foil and said second copper foil in desired shapes;
printing a second bump on a third copper foil;
stacking said third copper foil, a second prepreg, said first copper foil, said first prepreg, said second copper foil, a third prepreg and a fourth copper foil;
heating and compressing said third copper foil, said second prepreg, said first copper foil, said first prepreg, said second copper foil, said third prepreg and said fourth copper foil to form a seven-layered structure in which said second bump extends through said second prepreg to contact said first copper foil; and
patterning said third copper foil and said fourth copper foil in desired shapes,
said second bump having a shape in which a surface contacting said third copper foil is larger than that contacting said first copper foil.

* * * * *